(12) United States Patent
Barwicz et al.

(10) Patent No.: US 11,239,631 B2
(45) Date of Patent: Feb. 1, 2022

(54) SELF-ALIGNMENT FEATURES FOR III-V RIDGE PROCESS AND ANGLED FACET DIE

(71) Applicant: INTERNATIONAL BUSINESS MACHINES CORPORATION, Armonk, NY (US)

(72) Inventors: Tymon Barwicz, Yorktown Heights, NY (US); Yves C. Martin, Ossining, NY (US); Jason S. Orcutt, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 16/584,218

(22) Filed: Sep. 26, 2019

(65) Prior Publication Data
US 2020/0028318 A1    Jan. 23, 2020

Related U.S. Application Data

(63) Continuation of application No. 15/618,958, filed on Jun. 9, 2017, now Pat. No. 10,490,971.

(51) Int. Cl.
*H01S 5/02375*    (2021.01)
*H01S 5/22*    (2006.01)
*H01S 5/0234*    (2021.01)
*H01S 5/02326*    (2021.01)
*H01S 5/042*    (2006.01)
*H01S 5/0237*    (2021.01)

(52) U.S. Cl.
CPC ........ *H01S 5/02375* (2021.01); *H01S 5/0234* (2021.01); *H01S 5/02326* (2021.01); *H01S 5/22* (2013.01); *H01S 5/0237* (2021.01); *H01S 5/04252* (2019.08); *H01S 2301/176* (2013.01)

(58) Field of Classification Search
CPC .................................................. H01S 5/02268
See application file for complete search history.

(56) References Cited

U.S. PATENT DOCUMENTS

| 5,059,552 | A |   | 10/1991 | Harder et al. |         |
|-----------|---|---|---------|---------------|---------|
| 5,259,049 | A |   | 11/1993 | Bona et al.   |         |
| 5,488,678 | A | * | 1/1996  | Taneya        | G02B 6/42 |
|           |   |   |         |               | 372/50.1 |
| 5,721,797 | A | * | 2/1998  | Basavanhally  | G02B 6/42 |
|           |   |   |         |               | 385/14   |

(Continued)

OTHER PUBLICATIONS

Barwicz, T. et al., "A Novel Approach to Photonic Packaging Leveraging Existing High-Throughput Microelectronic Facilities" IEEE Journal of Selected Topics in Quantum Electronics (Nov./Dec. 2016) pp. 1-11, vol. 22, No. 6.

(Continued)

*Primary Examiner* — Tod T Van Roy
(74) *Attorney, Agent, or Firm* — Tutunjian & Bitetto, P.C.; Randall Bluestone

(57) ABSTRACT

A method of forming a laser including device is provided that in one embodiment includes providing a laser chip including at least one ridge structure that provides an alignment features. The method further includes bonding a type IV photonics chip to the laser chip, wherein a vertical alignment feature from the type IV photonics chip is inserted in a recess relative to the at least one ridge structure that provides the alignment features of the laser structure.

20 Claims, 4 Drawing Sheets

(56) References Cited

U.S. PATENT DOCUMENTS

| | | | | |
|---|---|---|---|---|
| 5,991,484 A | * | 11/1999 | Harpin | G02B 6/42 |
| | | | | 216/11 |
| 6,888,989 B1 | | 5/2005 | Zhou et al. | |
| 6,933,536 B2 | * | 8/2005 | Bowen | H01S 5/227 |
| | | | | 257/98 |
| 7,083,994 B2 | | 8/2006 | O'Gorman | |
| 7,245,645 B2 | | 7/2007 | Behfar et al. | |
| 8,787,419 B2 | | 7/2014 | Behfar | |
| 9,364,925 B2 | | 6/2016 | Barwicz et al. | |
| 2001/0009597 A1 | * | 7/2001 | Alibert | G02B 6/423 |
| | | | | 385/52 |
| 2009/0324173 A1 | * | 12/2009 | Asghari | G02B 6/42 |
| | | | | 385/52 |
| 2015/0295387 A1 | * | 10/2015 | Obata | H01S 5/3063 |
| | | | | 372/45.01 |
| 2016/0252688 A1 | | 9/2016 | Barwicz et al. | |

OTHER PUBLICATIONS

Martin, Y. et al., "Toward high-yield 3D self-alignment of flip-chip assemblies via solder surface tension" 2016 IEEE 66th Electronic Components and Technology Conference (Aug. 2016) pp. 588-594.
List of IBM Patents or Patent Applications Treated as Related dated Sep. 26, 2019, 2 pages.

* cited by examiner

SELF-ALIGNMENT FEATURES FOR III-V RIDGE PROCESS AND ANGLED FACET DIE

STATEMENT REGARDING FEDERALLY SPONSORED RESEARCH OR DEVELOPMENT

This invention was made with Government support under DE-AR0000540 awarded by the department of energy. The Government has certain rights in this invention.

BACKGROUND

Technical Field

This disclosure generally relates to the assembly of microelectronic, photonic and optoelectronic devices.

Description of the Related Art

Assembling flip-chip package structures typically utilize lithographically defined mechanical stops in conjunction with a solder reflow process to align components in one or two dimensions. However, such alignment and packaging techniques can be ineffective to accurately align package components due to various tolerances that exist in certain fabrication and assembly processes. Such variations in chip sizes and placement can result in misalignment of assembled components when using mechanical stops and solder reflow techniques for alignment.

SUMMARY

In one embodiment, a method of forming a laser including device is provided that includes providing a laser chip including at least one ridge structure that provides alignment features; and bonding a type IV photonics chip to the laser chip, wherein an alignment feature from the type IV photonics chip is vertically aligned and laterally aligned when inserted into a recess relative to the at least one ridge structure that provides the alignment features of the laser chip. The type IV photonics chip bonded to the laser chip by solder connection to bonding pads that are separate from the alignment features of the laser chip.

In another embodiment, a method of forming a laser including device is provided that includes providing a laser chip including at least one ridge structure that provides an alignment features defining an angled cavity; and bonding a type IV photonics chip to the laser chip, wherein an alignment feature from the type IV photonics chip is vertically aligned and laterally aligned when inserted into the angled cavity defined by the alignment features of the laser chip. The type IV photonics chip bonded to the laser chip by solder connection to bonding pads that are separate from the alignment features of the laser chip.

In yet another embodiment, a laser device is provided that includes a laser chip including a ridge laser including a first ridge structure overlying a multi-quantum well having an electrical contact to the first ridge structure, and at least a second ridge structure as an alignment features to provide an alignment cavity. The laser chip also includes a type IV photonics chip including an vertical alignment feature. The alignment feature providing vertical and lateral alignment when inserted in the alignment cavity. The laser device further including bonding pads for each of the laser chip and the type IV photonics chip that are separate from the alignment cavity and the alignment features, the bonding pads being bonded to one another through a solder bond.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
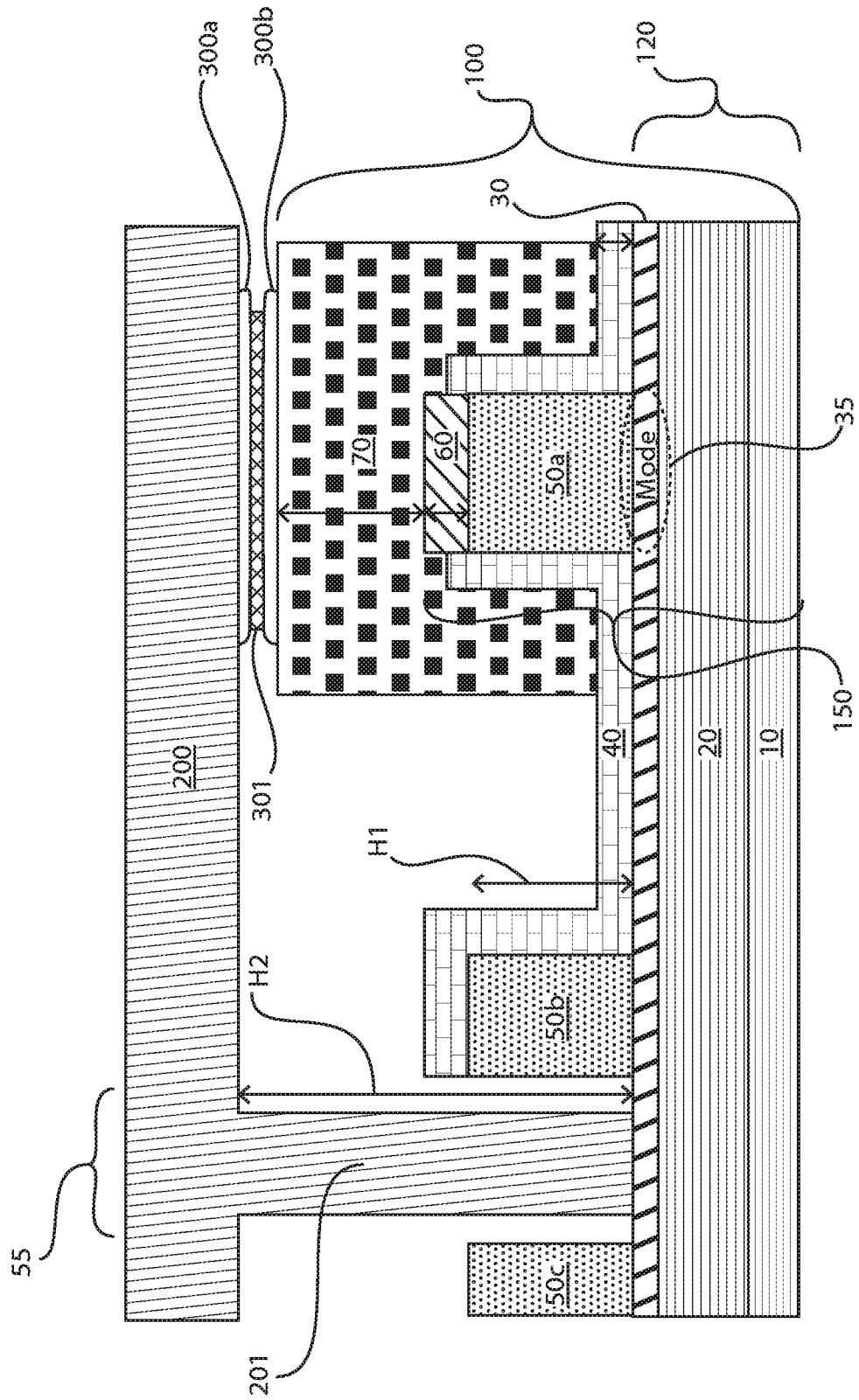
FIG. 1 is a side cross-sectional view depicting a laser device including a laser chip including a ridge laser including a second ridge structure as an alignment feature to provide an alignment cavity and a type IV photonics chip including an vertical alignment feature positioned within the alignment cavity, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The methods and structures described herein are provided for packaging of photonics and optoelectronic devices in which three-dimensional alignment of package components is achieved using solder surface tensions during a reflow process to move one or more package components and align such components in X, Y and Z directions using mechanical stops and butting techniques. The three dimensions alignment of package components that are described herein may be applied to ridge structures of semiconductor lasers. The "ridge structure" may be a narrow plateau of semiconductor material that is overlying a gain region of a laser, in which a dielectric layer is present on the sidewalls of the plateau of semiconductor material. The alignment methods described herein can be applied to any ridge structure, which can include III-V semiconductor materials, and may also include angled facet alignment structures for the cleaved bars. The simple ridge structure provides a self-aligned reference feature. This enables self-alignment without any tolerance requirements being placed on the laser manufacturer. The details of the methods and structures described herein are now described with greater detail with reference to FIGS. 1-4.

FIG. 1 depicts a laser chip 100 including a ridge laser 150 including a first ridge structure 50a overlying a multi-quantum well 30 having an electrical contact 60, 70 to the first ridge structure 50a and at least a second ridge structure 50b, 50c as an alignment features to provide an alignment cavity 55 and a type IV photonic chip 200 having an vertical alignment feature 201 that is inserted within the alignment cavity 55 to provide both vertical and lateral alignment of the type IV photonic chip 200 and the laser chip 100. Bonding is accomplished through separate solder pads 300a, 300b to each of the type IV photonic chip 200 and the laser chip 100 having a solder bond 301 providing engagement thereto.

Exemplary embodiments of the invention will be discussed in the context of optical applications in which three-dimensional alignment is achieved between a type III-V laser chip and a type IV photonics chip using solder surface tension during solder reflow to move the laser chip into alignment with the photonics chip using alignment features provided by the ridge structures of a ridge laser and mechanical stops.

As explained in detail below, during solder reflow, surface tension forces of a melted solder can move a chip by more than one hundred microns (μm). Self-alignment of the chips is provided by constraining the motions to lithographically defined mechanical stops that are aligned to ridge structures 50a, 50b, 50c. Exemplary embodiments of the invention can be implemented in conjunction with standard high-speed pick and place tooling followed by standard solder reflow for high-accuracy flip chip assembly. Again, while example embodiments are described with reference to aligning a flip-chip assembly including a ridge laser 150 to a type IV photonic chip 200, the techniques described herein can be applied to any flip-chip assembly requiring high alignment accuracy.

Referring to FIG. 1, the laser chip 100 comprises a multilayered stack 120 including the back contact 10 for the ridge laser 150, a first cladding layer 20, and a multi-quantum well 30. The back contact 10 may be a n-type contact composed of a metal, e.g., titanium and/or copper and/or aluminum, or the back contact 10 may be a doped semiconductor such as a type III-V semiconductor material doped to an n-type conductivity type. The first cladding layer 20 is composed of a type III-V semiconductor material that is doped to have an n-type conductivity. For example, the first cladding layer 20 may be composed of indium phosphide (InP) that is n-type. Indium phosphide is only one example of the composition of the first cladding layer 20, and it is not intended that the layer be defined by only this composition, as any type III-V semiconductor material may be substituted for the first cladding layer 20.

The multi-quantum well 30 provides the gain region of the ridge laser 150. A "gain region" is a medium which can amplify the power of light (typically in the form of a light beam). The term "quantum well" or "QW" used herein refers to a thin-layer structure comprising alternate layers consisting of a first semiconductor layer with a thickness smaller than the de Broglie wavelength of about 200 Å to 300 Å with respect to electrons or holes, and at least a second semiconductor layer with a band gap greater than that of the first semiconductor layer. The term "band gap" refers to the energy difference between the top of the valance band (i.e., Ev) and the bottom of the conduction band (i.e., Ec). A QW structure can be formed by sandwiching a semiconductor thin layer of a narrow band gap between semiconductor layers of a large band gap. Lasers containing more than one quantum well layer are known as multiple quantum well lasers. The active region in the quantum well structure is formed by alternating layers of relatively low bandgap material and layers of relatively high bandgap material. As used herein, a "low bandgap" is a bandgap ranges from 0.5 eV to 3.0 eV, and a "high bandgap" ranges from 1.0 eV to 3.5 eV. The former layers are termed "well layers" and the latter layers are termed "barrier layers". The thickness of each layer of III-V compound semiconductor material within the quantum well may be no greater than 50 nm. In some embodiments, the stacked structure of quantum wells may be composed of 1 to 100 layers of semiconductor material, such as III-V compound semiconductor material. In one example, the quantum well is composed of alternating layers of indium phosphide (InP) and gallium phosphide (GaP). The active region provided by the MQW 30 may be an intrinsic (I) region provided by intrinsic semiconductor layers. By "intrinsic" it is meant that the region is not doped with an extrinsic dopant, e.g., n-type or p-type dopant. The above example compositions, dimensions, and number of layers in the MQW 30 provide only one example of a quantum well 30, and it is not intended that the quantum well 30 be defined by only these compositions, as other type III-V semiconductor material may also be used in the quantum well 30.

Still referring to FIG. 1, a plurality of ridge structures 50a, 50b, 50c can be present atop the multi-quantum well 30. The plurality of ridge structures 50a, 50b, 50c includes at least one first ridge structure 50a that an active portion of the ridge laser 150 and at least one second ridge structure 50b, 50c that provide alignment features for defining an alignment cavity 55 that provides for aligned engagement of the laser structure 100 to an alignment feature 201 of the type IV photonic chip 200. The at least one second ridges structure 50b, 50c is used as a mechanical alignment feature that enables self-alignment.

The at least one first ridge structure 50a may provide a second cladding layer for the ridge laser 150. In some embodiments, the first and second conductivity type III-V semiconductor material layers function to pump charge carriers, i.e., electron and hole charge carriers, into the intrinsic active area provided by the quantum well. In one example, the at least one ridge structure 50a is composed of a type III-V semiconductor material, such as indium phosphide (InP), having an opposite conductivity type as the first cladding layer 20. For example, the first conductivity type III-V semiconductor material layer may be doped to an n-type conductivity, and the second cladding layer provided by the at least one first ridge structure 50a can be a type III-V semiconductor material layer that is doped to a p-type conductivity.

The at least one ridge structure 50a has a pedestal geometry, in which the active region 35 (also referred to as the gain region) of the ridge laser 150 is the portion of the MQW 30 that is present between the at least one ridge structure 50a and the first cladding layer 20. The at least one ridge structure 50a also includes a dielectric layer 40 that is present on the sidewalls of the at least one ridge structure 50a, which can be composed of any dielectric material, such as nitride, e.g., silicon nitride, an oxide, e.g., silicon oxide and/or oxynitride, such as silicon oxynitride. The upper surface of the at least one first ridge structure 50a may be the site of an ohmic contact 60. The ohmic contact 60 may be composed of nickel or gold. In some embodiments, the ohmic contact 60 may alloy the III-V semiconductor material of the at least one ridge structure 50a. The ohmic contact 60 may be in direct electrical contact with a plated contact 70 that encapsulates the at least one ridge structure 50a, as depcited in FIG. 1. The plated contact 70 may be composed of gold, or another like metal. A contact pad 300b for the laser chip 100 may be present atop the plated contact 70. The contact pad 300a, 300b is for engagement to a solder bond 301 for the bonding of the laser chip 100 to the type IV photonics chip 200. During solder bonding with the solder bond 301, as well as any reflow processing, the vertical alignment and lateral alignment of the laser chip 100 to the type IV photonics chip 200 can be controlled by insertion of the alignment feature 201 of the type IV photonic chip 200 into the alignment cavity defined by the at least one second ridge structure 50b, 50c.

The at least one second ridge structure 50b, 50c is similar to the at least one first ridge structure 50a. For example, the at least one second ridge structure 50b, 50c and the at least one first ridge structure 50a may have a same height H1. In some examples, the height H1 of the at least one ridge structure 50a, 50b, 50c may range from 1000 nm to 5000 nm. In the embodiment depicted in FIG. 1, there are two of the second ridge structures 50b, 50c that are separated from one, in which the height H1 of the at least one second ridge structure 50b, 50c extends above an exposed portion of the MQW 30 to provide an alignment cavity 55.

The at least one second ridge structure 50b, 50c may have a same composition as the at least one first ridge structure 50a. The plurality of ridge structures 50a, 50b, 50c may be formed using the same process conditions at the same process step. This provides that the alignment features 50b, 50c are produced by a process sequence that does not significantly increasing the number of manufacturing steps that are required to provide a ridge structure 50a for a ridge laser 50a. Therefore, the use of the ridge structures 50b, 50c as alignment features allows for a self-alignment process.

The dielectric layer 40 that is in direct contact with the sidewalls of the at least one first ridge structure 50a is a conformal layer that extends across the portion of the MQW layer 30 separating the at least one first ridge structure 50a from the at least one second ridge structure 50b, 50c. The dielectric layer 40 is also present on a sidewall of at least one of the second ridge structure 50b, as well as being present on an upper surface of the at least one second ridge structure 50b. The dielectric layer 40 does not extend into the alignment cavity 55, in which an exposed surface of the MQW layer 30 provides an accurate reference level for alignment of the type IV photonics chip 200.

Still referring to FIG. 1, the type IV photonics chip 200 may be composed of silicon (Si), but any type IV semiconductor material may also be employed, such as germanium and/or silicon germanium. The type IV photonic chip 200 may include a vertical alignment feature 201. The vertical alignment feature 201 may also be composed of a semiconductor material, such as a type IV semiconductor material, e.g., silicon, but in some embodiments other materials may be employed for the alignment feature 201, such as other semiconductor materials, dielectrics and metals. The dimensions of the vertical alignment feature 201 are selected so that it may fit within the alignment cavity 55, and provide for self-alignment between the type IV photonics chip 200 and the laser chip 100. The insertion of the vertical alignment feature 21 into the alignment cavity 55 provides for both lateral alignment and vertical alignment of the type IV photonic chip 200 and the laser chip 100. Bonding between the type IV photonic chip 200 and the laser chip 100 is provided by solder bonding 301 to the engage the solder pads 300a, 300b to each of the type IV photonic chip 200 and the laser chip 100. The vertical alignment feature 201 is configured to make contact with a surface of the MQW layer 30 during assembly and, therefore, serve as vertical standoffs (or posts) for Z-direction alignment during flip-chip assembly of the laser containing chip 100 and the type IV photonics chip 200. Moreover, as explained below, the vertical standoff structure further serves as a mechanical stop for X-direction alignment during flip-chip assembly of the laser chip 100 and the type photonics chip 200.

In some embodiments, a bonding pad 300b is present on an upper surface of the plated contact 70 for the laser chip 100, and a bonding pad 300a is present on a portion of the type IV photonics chip 200 opposing the bonding pad 300b that is present on the plated contact 70. The bonding pads 300a, 300b are separate from the alignment features 201, 55, 55a, 55b. It is to be noted that the term "bonding pad" as used herein refers to corresponding bonding pads that are used for flip-chip bonding a first chip (e.g., laser chip 100) to a second chip (e.g., type IV photonics chip 200) using solder connections 301. A soldered pair, i.e., solder bonded 301, of corresponding bonding pads 300a, 300b can be a passive structure that simply serves as a structural flip-chip bond between the chips. In addition, a soldered pair, i.e., solder bond 301, of corresponding bonding pads 300a, 300b can serve not only as a structural bond, but also serve as an electrical connection (power, ground, I/O signals, etc.) between the chips. Moreover, depending on the application, other metallic pads may exist on the surfaces of the chips that are not actually used for flip-chip bonding.

The bonding pads 300a, 300b may be composed of a metallic material. In one embodiment of the invention, the bonding pads are formed using UBM (under bump metallization) techniques, wherein the metallic bonding pads can be formed of Ni, Cu, or Au, or a combination thereof.

As shown in FIG. 1, to enable flip-chip bonding of the laser chip 100 to the type IV photonics chip 200, solder 301 is formed on the bonding pads 300a, 300b. In one embodiment of the invention, solder 301 is deposited on the bonding pads 300a, 300b using, e.g., an electroplating process. In one embodiment of the invention, the solder 301 is formed of Sn and Ag, e.g., Sn-0.6 wt % Ag.

Figure 2:
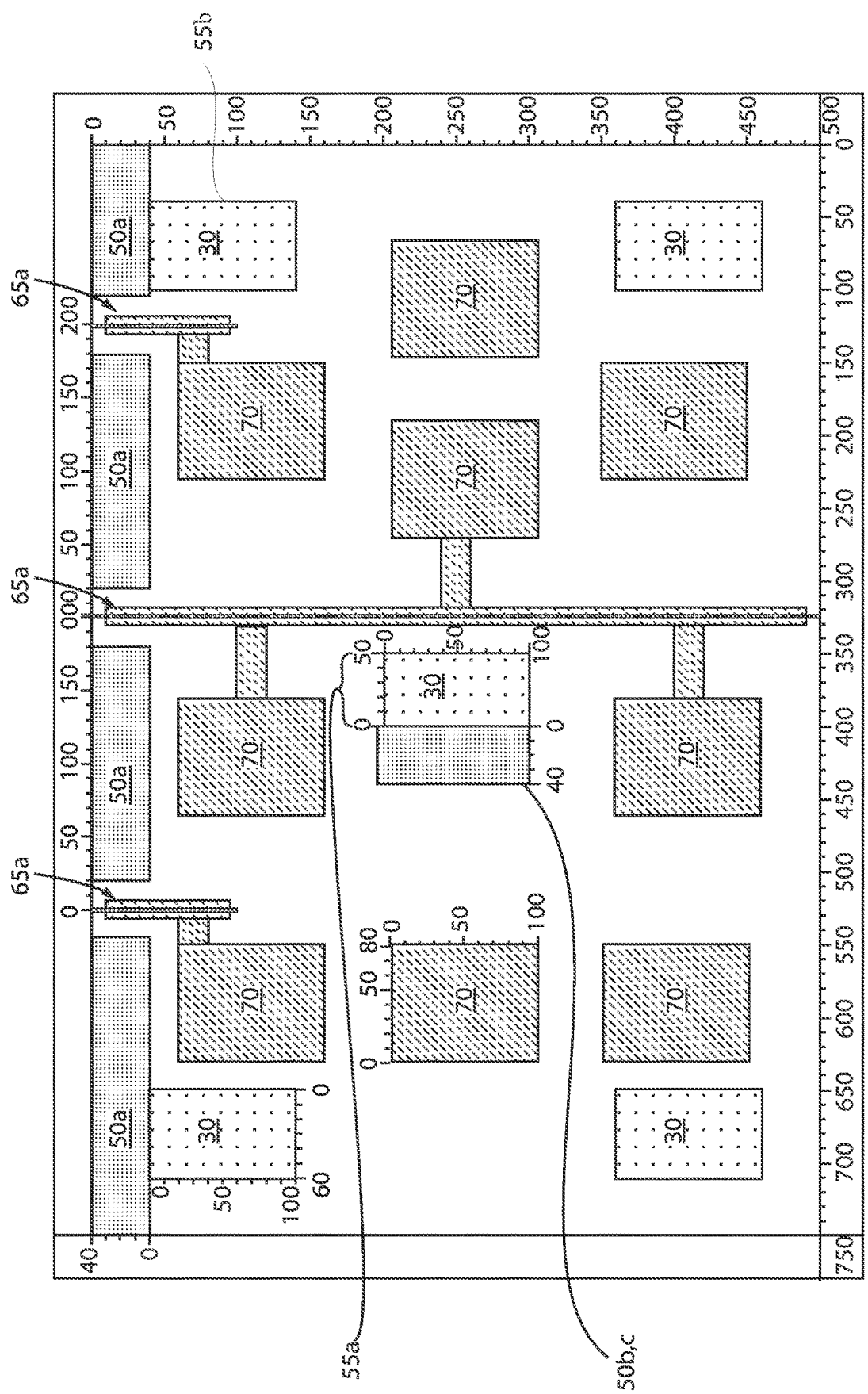
FIG. 2 is a top down view depicting one embodiment of the laser chip depicted in FIG. 1 including an straight alignment cavity, in accordance with one embodiment of the present disclosure.

FIG. 2 depicts one embodiment of the laser device depicted in FIG. 1 including an straight alignment cavity 55a. In one embodiments, the laser chip 100 includes five MQW layer 30 surface alignment regions 30 that are exposed through alignment cavities 55a, 55b that are adjacent to ridge structures 50a, 50b, 50c. The surface alignment features including the alignment cavities identified by reference number 55b are present around the perimeter of the laser chip 100 and provide for vertical alignment only, in which strip abutment is not needed. The center alignment region 30 that is present in an alignment cavity having reference number 55a abuts against a ridge alignment structure 50b (may also be 50c). The ridge alignment structure 50b provides for lateral alignment of the laser chip 100.

Referring to FIGS. 1 and 2, the alignment ridge (AR) edge can have ridge regions 50b outside of the gain/detector stripes 50a of the ridge laser 150 to serve as an abutting structure during solder bonding processes. The plated contact 70 layout that is depicted in FIG. 2 illustrates only one embodiment of the present disclosure. In some embodiments, several isolated pads are needed to provide reflow force for self-alignment. In some embodiments, the longer cavities add space between pads/features, but does not change pad and/or alignment feature dimensions.

The laser chip 100 configuration that is depicted in FIG. 2 includes a trench having a straight alignment cavity 55a. By straight alignment cavity 55a it is meant that all opposing sidewalls of the cavity are parallel to one another, as depicted in FIG. 2.

Figure 3:
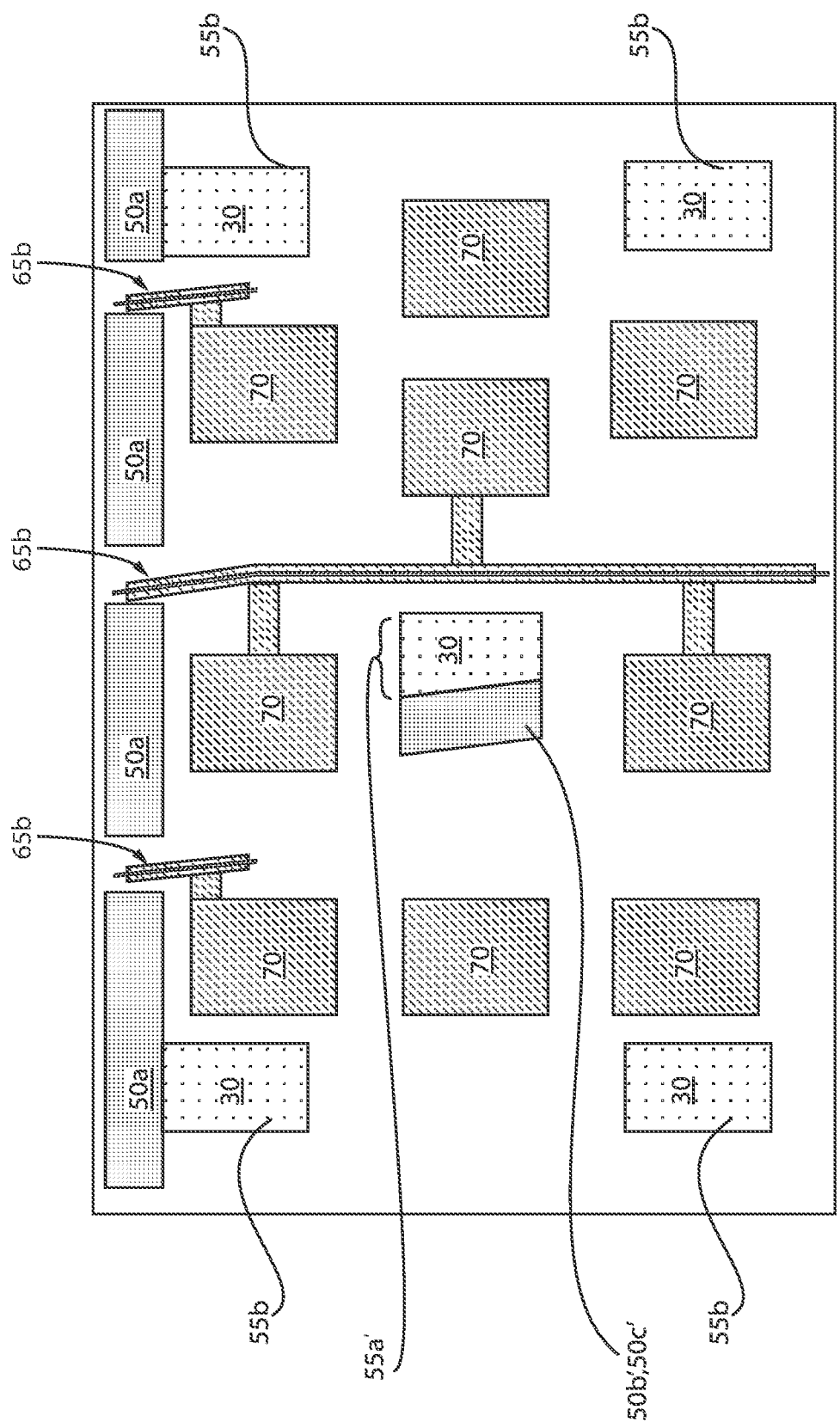
FIG. 3 is a top down view depicting another embodiment of the laser chip depicted in FIG. 2 including an angled alignment cavity, in accordance with another embodiment of the present disclosure.

FIG. 3 is a top down view depicting another embodiment of the laser device 100 depicted in FIG. 1 including an angled alignment cavity 55a'. The center alignment region 30 that is present in alignment cavity having reference number 55a' abuts against a ridge alignment structure 50b' (may also be 50c'). The ridge alignment structure 50b' provides for lateral alignment of the laser chip 100 depicted in FIG. 3.

The laser device 100 that is depicted in the top down view illustrated in FIG. 3 is very similar to the laser device 100 that is depicted in the top down view illustrated in FIG. 2. The difference between the laser device 100 depicted in FIGS. 1 and 2, when compared to the laser device 100 depicted in FIGS. 1 and 3, is that the laser device depicted in FIG. 3 includes an angled alignment cavity 55a', while the laser device depicted in FIG. 2 includes a straight alignment cavity 55a. With exception of the angled alignment cavity 55a' and the straight alignment cavity 55a, the remainder of the structures depicted in FIG. 3 that share a reference number with the structures depicted in FIG. 2 are substantially the same.

Referring to FIG. 3, in some embodiments, the angled alignment cavity 55b may include an outside sidewall 51 that intersects with a base sidewall S2 at an obtuse angle α. In some embodiments, the angled alignment cavity 55a' has an obtuse angle α that ranges from 95° to 130°. In other embodiments, the angled alignment cavity 55a' has an obtuse angle α that ranges from 110° to 120°.

In some embodiments, the angled alignment cavity 55a' eliminates cleave uncertainty impact on lateral alignment of the angled optical interface 65b. In some embodiments, when compared to the straight optical interface 65a depicted in FIG. 2, the angled optical interface 65b that is depicted in FIG. 3 provides an interface reflectance that is approximately one order of magnitude lower than the straight optical interface.

Figure 4:
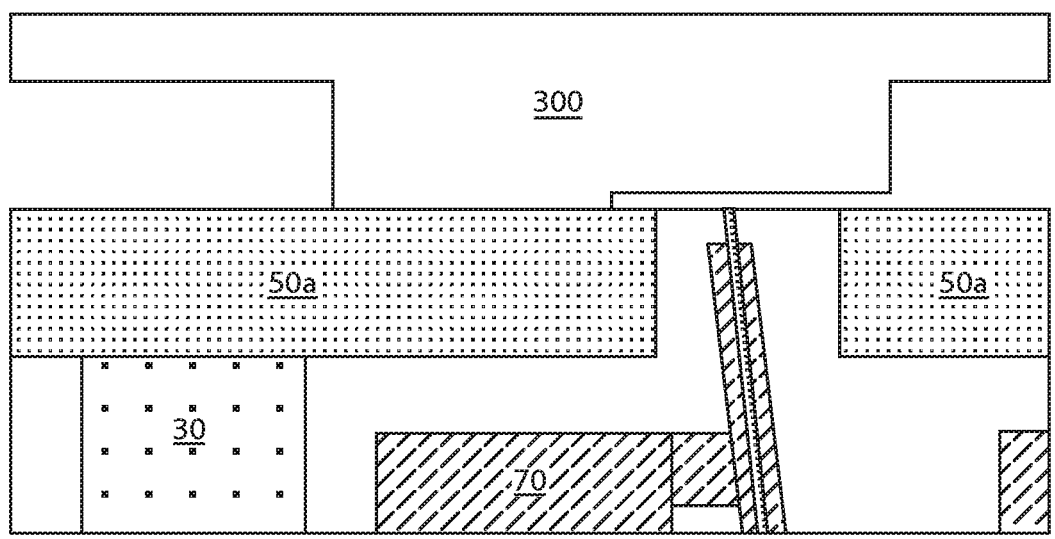
FIG. 4 is a top down view illustrating one embodiment of protecting the facets from damage during abutment with a silicon photonic facet shape.

FIG. 4 depicts one embodiment of protecting the facets from damage during abutment with a silicon photonic facet shape 300. In some embodiments, the methods and structures disclosed herein abut a silicon photonic facet shape 300 to a ridge separated from the laser by recessing the silicon photonic chip face shape 300 by 100 nm to 200 nm to protect the laser.

In some embodiments, the structures depicted in FIGS. 1-4 produce a method of forming a laser including device that includes the steps of providing a laser chip 100 including at least one ridge structure 50a, 50b, 50c that provides alignment features 55, 55a, 55b; and bonding a type IV photonics chip 200 to the laser chip 100, wherein a vertical alignment feature 201 from the type IV photonic chip 200 is inserted into an alignment cavity that is a recess relative to the at least one ridge structure 50a, 50b, 50c that provides the alignment features of the laser chip 100 for at least one of vertical alignment and lateral alignment between the type IV photonics chip and the laser chip.

The laser chip 100 includes a first ridge structure 50a of the at least one ridge structure is in direct electrical contact to a gain region of the laser structure 150 (hereafter referred to as ridge laser). The ridge laser 150 includes a dielectric layer 40 on sidewalls of the first ridge structure 50a, an upper surface of the first ridge structure 50a including a metallized region 60, wherein the metallized region 60 is in direct contact with a contact 70 having a first conductivity. The gain region of the laser structure is the multi-quantum well region 30.

In some embodiments, includes placing the type IV photonics chip 200 within the alignment cavity 55a of the laser chip 100 that is defined by the ridge structures 50b, 50c. In one embodiment of the invention, this step is performed using any standard pick and place tool/process for flip-chip technologies following a wafer dicing process. In general, wafer dicing involves mounting a wafer (which comprises a plurality of the type IV photonic chips 200 formed thereon, for example) on a cutting ring, stretching wafer tape over back of the wafer, mounting the wafer on a dicing chuck, and cutting the wafer into individual dies (e.g., individual laser chips) using a diamond blade. With the wafer dicing process, the wafer is cut into individual dies without cutting through the wafer tape so that the individual dies remain attached to the wafer tape after the dicing process. Following wafer dicing, a pick and place machine (semi-automated or fully automated) is used to lift an individual die (e.g., type IV photonics chip 200) from the wafer tape (via a vacuum collet), and place the die onto a substrate, package, or other die stack, for example (e.g., place a type IV photonics chip 200 on the laser chip 100). With an automated pick and place tool, the X and Y positioning is performed automatically using a pattern recognition system.

After the pick and placement process is completed, a solder reflow process is initiated. For example, the flat electroplated solders 301 begin to melt during the initial phase of the solder reflow process, the flat electroplated solders 301 become ball-shaped, which causes the solders 80 to make contact to corresponding ones of the bonding pads between the contact pad 300b of the laser chip 100 and the contact pad 300a of the type IV photonics chip 200. Once the molten solders 301 touch the bonding pads 300a, 300b of the laser chip 100 and the type IV photonics chip 200, the molten solders 80 start wetting and spreading on the bonding pads. During reflow, the surface tension forces of the melted solder 80 on the bonding pads 300b of the laser chip 100 are effective to induce movement of the laser chip 100 to minimize the surface energy of the molten solder 301.

Once the vertical alignment feature 201 of the type IV photonics chip 200 is butted against the exposed portion of the MQW layer 30 in the alignment cavity 55a that is adjacent to the alignment ridge structures 50b, 50b', 50c, 50c', the laser chip 100 will be aligned to the photonics chip 200 in both the X and Y and Z directions. In some embodiments, the alignment cavity 55a is straight, as depicted in FIG. 2. In some embodiments, the alignment cavity 55a is angled, as depicted in FIG. 3.

A design for a laser including device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of laser including devices and/or integrated circuit chips with laser devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor.

It should also be understood that material compounds will be described in terms of listed elements, e.g., GaInP, InGaAs or SiGe. These compounds include different proportions of the elements within the compound, e.g., InGaAs includes $In_xGa_{1-x}As$, where x is less than or equal to 1, or SiGe includes $Si_xGe_{1-x}$ where x is less than or equal to 1, etc. In addition, other elements may be included in the compound, such as, e.g., AlInGaAs, and still function in accordance with the present principles. The compounds with additional elements will be referred to herein as alloys.

Having described preferred embodiments of self-alignment features for III-V ridge processes and/or angled facet die, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a laser including device comprising:
providing a laser chip including a first ridge structure as a component of a ridge laser that is atop a multi quantum well layer, and at least one second ridge structure that provides a cavity that provides alignment features, the first ridge structure and the at least one second ridge structures composed of a same material composition, wherein the multi quantum well layer extends laterally from the ridge laser to the alignment features, the first ridge structure and the at least one second ridge structures being a plateau of semiconductor material over the multi quantum well layer of the laser, and a dielectric layer is located on the second ridge structure; and
bonding a photonics chip to the laser chip, wherein the photonics chip is vertically aligned and laterally aligned to the laser chip, when an alignment feature from the photonics chip is inserted into a recess of the cavity relative to the at least one second ridge structure that provides the alignment features of the laser chip, the alignment feature from the photonics chip contacting the multi quantum well layer, wherein the photonics chip is bonded to the laser chip by solder connection to bonding pads of the laser chip and the photonics chip that are separate from the alignment features.

2. The method of claim 1, wherein the laser chip includes the first ridge structure that is in direct electrical contact to a gain region of the laser chip.

3. The method of claim 2, further comprising a dielectric layer on sidewalls of the first ridge structure, an upper surface of the first ridge structure including a metallized region, wherein the metallized region is in direct contact with a contact having a first conductivity.

4. The method of claim 3, wherein the gain region of the laser structure is multi-quantum well provided by the multi quantum well layer.

5. The method of claim 4, wherein the first ridge structure is composed of a type III-V semiconductor material having a first conductivity type, and the laser structure further includes a layer of type III-V semiconductor material underlying the quantum well having a second conductivity type.

6. The method of claim 4, wherein the laser structure includes at least said second ridge structure of the at least one ridge structure that provides said alignment features, such at least said second ridge structure providing an alignment cavity for engagement by said alignment feature of the photonics chip which is a vertical alignment feature.

7. The method of claim 6, wherein said alignment cavity is angled.

8. A method of forming a laser including device comprising:
providing a laser chip including a first ridge structure as a component of a ridge laser that is atop a multi quantum well layer, and at least one second ridge structure that provides an angled cavity that provides alignment features, the first ridge structure and the at least one second ridge structures composed of a same material composition and being a plateau of semiconductor material over the multi quantum well layer of the laser, and a dielectric layer is located on the second ridge structure, wherein the multi quantum well layer extends laterally from the ridge laser to the alignment features by a dimension ranging from 100 nm to 200 nm; and
bonding a photonics chip to the laser chip, wherein an alignment feature from the photonics chip is vertically aligned and laterally aligned when inserted into the angled cavity that provides the alignment features of the laser chip, the alignment feature from the photonics chip contacting the multi quantum well layer, wherein the photonics chip is bonded to the laser chip by a solder connection to bonding pads that are separate from the alignment features of the laser chip.

9. The method of claim 8, wherein the laser chip includes the first ridge structure that is in direct electrical contact to a gain region of the laser structure.

10. The method of claim 9, wherein the gain region of the laser structure is multi-quantum well provide by the multi quantum well layer.

11. The method of claim 10, wherein the first ridge structure is composed of a type III-V semiconductor material having a first conductivity type, and the laser chip further includes a layer of type III-V semiconductor material underlying the quantum well having a second conductivity type.

12. The method of claim 9, wherein the laser structure includes at least said second ridge structure of the at least one ridge structure that provides said alignment features, such at least said second ridge structure providing the angled cavity for engagement by said alignment feature of the photonics chip which is a vertical alignment feature.

13. A laser device comprising:
a laser chip including a ridge laser including a first ridge structure overlying a multi-quantum well having an electrical contact to the first ridge structure and at least one second ridge structure as an alignment feature to provide an alignment cavity, the first ridge structure and the at least one second ridge structure composed of a same material composition and being a plateau of semiconductor material over the multi quantum well layer of the laser, and a dielectric layer is located on the second ridge structure, the multi quantum well provided by a multi quantum well layer that extends laterally from the ridge laser to the alignment cavity; and
a photonics chip including an alignment feature that is positioned within the alignment cavity to align the photonics chip to the laser chip vertically and laterally, the laser chip bound to the photonics chip by solder connection to bonding pads that are separate from the alignment features of the laser chip and the alignment feature of the photonics chip, the alignment feature of the photonics chip contacting a portion of the multi-quantum well layer within the alignment cavity.

14. The laser device of claim 13, further comprising a dielectric layer on sidewalls of the first ridge structure.

15. The laser device of claim 14, wherein an upper surface of the first ridge structure includes a metallized region, wherein the metallized region is in direct contact with a contact having a first conductivity.

16. The laser device of claim 15, wherein the first ridge structure is composed of a type III-V semiconductor material having a first conductivity type.

17. The laser device of claim 16, further comprising a layer of type III-V semiconductor material underlying the quantum well having a second conductivity type.

18. The laser device of claim 13, wherein the multi-quantum well is a portion of the gain region of the laser chip.

19. The laser device of claim 18, wherein the alignment cavity is angled.

20. The laser device of claim 13, wherein the alignment feature of the photonics chip is facetted.

* * * * *